United States Patent [19]

Faber et al.

[11] Patent Number: 5,058,070
[45] Date of Patent: Oct. 15, 1991

[54] HIGH SPEED MEMORY WITH ROW REDUNDANCY

[75] Inventors: Allen B. Faber, Vancouver, Wash.; Thomas N. Mathes, Austin, Tex.

[73] Assignee: Motorola, Inc., Schaumburg, Ill.

[21] Appl. No.: 478,907

[22] Filed: Feb. 12, 1990

[51] Int. Cl.$^5$ ............................................. G11C 13/00
[52] U.S. Cl. ..................................... 365/200; 365/96; 371/10.3
[58] Field of Search ..................... 365/96, 200; 371/10

[56] References Cited

U.S. PATENT DOCUMENTS

| | | | |
|---|---|---|---|
| 3,245,051 | 4/1966 | Robb | 365/96 |
| 4,587,638 | 5/1986 | Isobe et al. | 365/200 |
| 4,862,417 | 8/1989 | List et al. | 365/200 |

Primary Examiner—Terrell W. Fears
Attorney, Agent, or Firm—Paul J. Polansky

[57] ABSTRACT

A high speed memory with row redundancy has a plurality of memory cells arranged in rows, with additional redundant rows. When a defect is detected in a row, a redundant row is used in place of the defective row. Each row select signal is decoded by a predecoder, receiving a row address, and a decoder, comprising a NOR gate and an output driver. The NOR gate performs a logical NOR on a set of predecoded signals. The output driver receives the output of the NOR gate and has a bipolar portion and a CMOS portion to provide a row select signal, with a fast rise time and with a CMOS voltage level, to each of a plurality of memory blocks. A defective row is deselected by blowing two fuses which are internal to the NOR gate. The fuses are placed adjacent to each other so that the two fuses may be blown in a single operation.

12 Claims, 3 Drawing Sheets

HIGH SPEED MEMORY WITH ROW REDUNDANCY

FIELD OF THE INVENTION

This invention relates generally to integrated circuit memories, and more particularly, to integrated circuit memories using row redundancy.

BACKGROUND OF THE INVENTION

An integrated circuit memory is commonly implemented as a plurality of rows in one or more blocks, crossing a plurality of bit line pairs. Memory cells are located at intersections of rows and bit line pairs, and are accessed when the row and the bit line pair on which they are located are selected. Rows and bit line pairs are selected by row and column decoding of the address, respectively. Additionally, block decoding may select between two or more memory blocks.

A desirable feature for integrated circuit memories is row redundancy. In an integrated circuit memory with row redundancy, a manufacturing defect in a particular row can be cured by using a redundant row in place of the defective row. Two operations are necessary to replace the defective row with the redundant row. First, the defective row must be deselected. Second, a redundant row must be assigned the address of the defective row, so that it functions in place of the defective row.

The defective row deselection and redundant row assignment may be implemented using fuses. A fuse element is typically a segment of polysilicon lacking an overlying layer of passivation. Prior to packaging, in which the integrated circuit still resides on a wafer and is being tested by a prober, a defective row can be deselected by blowing a fuse connected to the row. The fuse is blown by applying a high-energy laser light focused to the approximate height of the polysilicon.

Row deselection may be achieved by placing fuses between the output signals of the row decoder and the row select lines. See, for example, Isobe et al. in U.S. Pat. No. 4,587,638 entitled "Semiconductor Memory Device". However, placing the fuses on the row select lines results in certain disadvantages. As semiconductor memories become larger, the row select lines must select more memory cells, and therefore are longer. The longer lines are more heavily loaded capacitively, and therefore an increase in resistance through the fuse increases the time constant of the row select line, and slows down the rise time of the row select lines and hence the access time of the memory. In very high speed memories in particular, this extra delay caused by placing fuses between the row decoder and the row select lines can make row redundancy infeasible.

BRIEF DESCRIPTION OF THE INVENTION

Accordingly, it is an object of the present invention to provide an improved high speed memory with row redundancy.

It is another object of the present invention to provide an improved fusible row select decoder.

It is yet another object of the present invention to provide an improved memory with deselect fuses which may be blown in a single operation.

It is still another object of the present invention to provide an improved high speed, fusible NOR gate.

In carrying out these and other objects of the invention, there is provided, in one form, a memory having a plurality of rows comprising at least one redundant row. The memory comprises a predecoding portion, a decoding portion, and a fuse portion. The predecoding portion provides a plurality of predecoded signals in response to a row address. The decoding portion is coupled to the predecoding portion, and has input terminals for receiving groups of predecoded signals, first internal terminals, second internal terminals, and output terminals. The decoding portion performs a predetermined logic operation on the groups of predecoded signals to provide a plurality of row select signals. The fuse portion selectively couples each first internal terminal of the decoding portion to a corresponding second internal terminal.

These and other objects, features and advantages will be more clearly understood from the following detailed description taken in conjunction with the accompanying drawings.

DETAILED DESCRIPTION OF THE INVENTION

Figure 1:
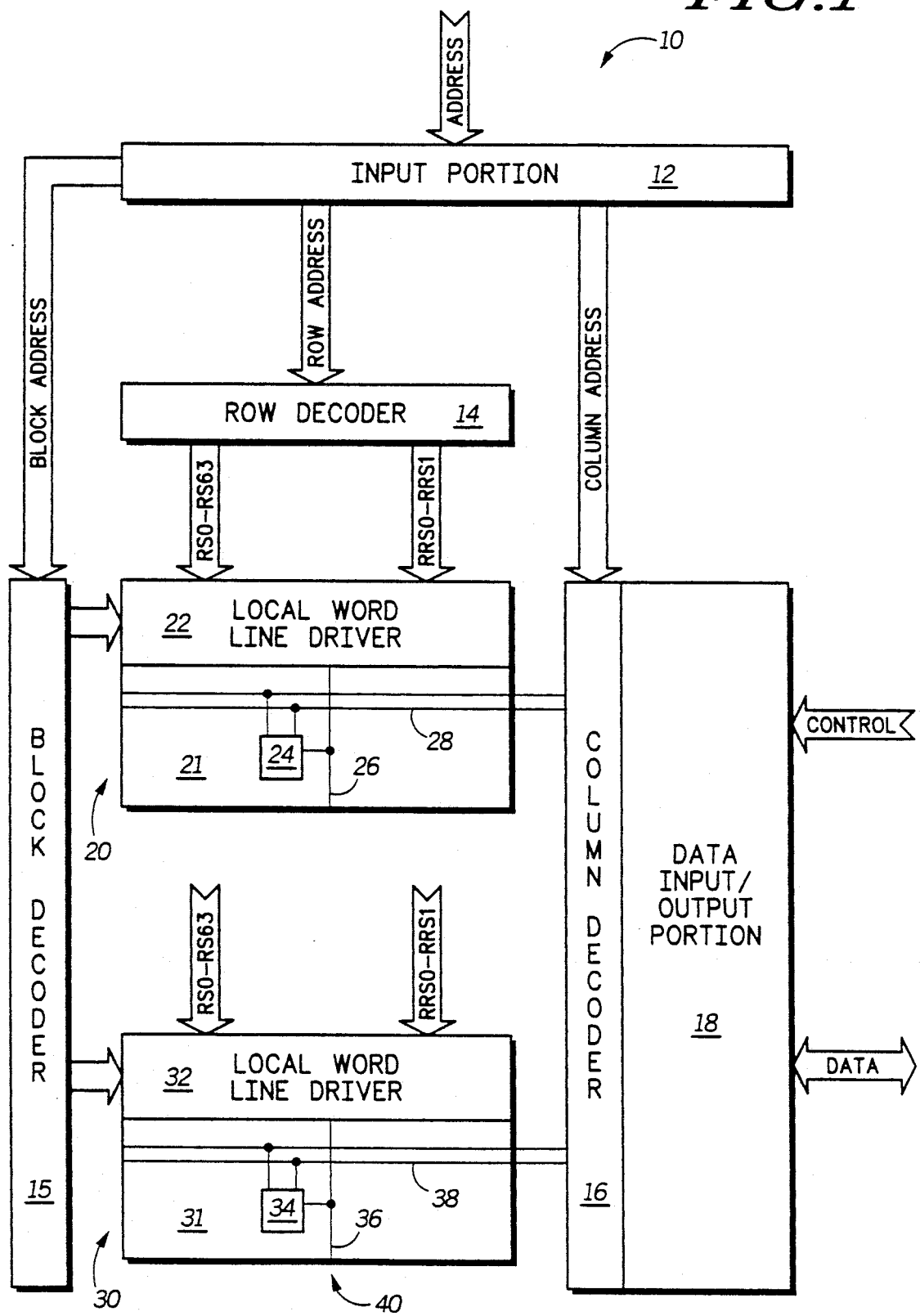
FIG. 1 shows a block diagram of a memory in accordance with a preferred embodiment of the present invention.

FIG. 1 shows a memory 10 in accordance with a preferred embodiment of the present invention. Memory 10 comprises an input portion 12, a row decoder 14, a block decoder 15, a column decoder 16, a data input-/output portion 18, a first block 20, and a second block 30. First block 20 comprises a memory array 21 and a local word line driver 22. Memory array 21 comprises a plurality of memory cells located at intersections of local word lines and bit line pairs, of which a cell 24 is shown as an example. Cell 24 is located at an intersection of a local word line 26, and bit line pair 28. Similarly, second block 30 comprises a memory array 31 and a local word line driver 32. Memory array 31 comprises a plurality of memory cells located at intersections of local word lines and bit line pairs, of which cell 34 is an example. Cell 34 is located at an intersection of a local word line 36, and a bit line pair 38. Cells 24 and 34 are both located on a row 40.

Input portion 12 receives a plurality of address signals designated "ADDRESS". When an access, either a read or a write operation, occurs on memory 10, input portion 12 decodes a block address labelled "BLOCK ADDRESS", a row address labelled "ROW ADDRESS", and a column address labelled "COLUMN ADDRESS" and provides the corresponding decoded address fields to other blocks. In addition, data input-/output portion 18 provides control and timing signals, not shown in FIG. 1, to the other blocks in response to a plurality of control signals labelled "CONTROL". Block decoder 15 receives BLOCK ADDRESS and couples to local word line drivers 22, 32, and others not shown. Row decoder 14 receives ROW ADDRESS, and outputs sixty-four row select signals labelled "RS0–RS63". In addition, row decoder 14 outputs two additional row select signals labelled "RRS0-RRS1" to select a redundant row when one of the sixty-four rows is defective.

Local word line driver 22 couples to block decoder 15 and to row decoder 14. When selected by BLOCK ADDRESS, local word line driver 22 selects one local word line in response to RS0-RS63, RRS0-RRS1, and a plurality of signals provided by block decoder 15. Four local word lines are coupled to a given row select signal and are said to be in the corresponding row. Each local word line driver selects one local word line out of four which are in a selected row in response to the plurality of signals provided by block decoder 15. It should be apparent, however, that different row organizations are possible. Likewise, local word line driver 32 couples to block decoder 15 and to row decoder 14, and when selected by BLOCK ADDRESS, selects one local word line in response to RS0-RS63, RRS0-RRS1, and a plurality of signals provided by block decoder 15. Column decoder 16 receives a plurality of bit line pairs from each memory block, including bit line pair 28 from memory block 20, and bit line pair 38 from memory block 30. Column decoder 16 selects one or more bit line pairs as determined by column decoding. The number of bit line pairs selected depends on the organization of the memory. Column decoder 16 couples the selected bit line pairs to data input/output portion 18. Data input/output portion 18 receives the selected bit line pairs, CONTROL, and couples to bidirectional signal lines labelled "DATA" externally. The CONTROL signals select modes of memory 10 and provide timing information to input portion 12, row decoder 14, block decoder 15, and data input output portion 18.

In a read mode of memory 10, encoded on CONTROL, DATA is provided by memory 10. Input portion 12 provides ROW ADDRESS, BLOCK ADDRESS, and COLUMN ADDRESS in response to corresponding fields of ADDRESS. Memory 10 provides buffered true and complement address signals for each address field to simplify decoding. Row decoder 14 receives ROW ADDRESS and provides RS0-RS63 in response. Row decoder 14 also provides RRS0 and RRS1 to select memory cells in two redundant rows. A defective row is detected during testing of the memory, usually in a probing operation. Replacing a defective row with a redundant row is a two step process. First, a defective row is disabled by blowing fuses in row decoder 14, a process known as deselection. Second, select logic for a defective row is coupled to RRS0 or RRS1 so that the redundant row is assigned the address of the defective row. Block decoder 15 receives BLOCK ADDRESS and provides a plurality of predecoded block signals to select one block, and to provide a one of four select within the selected block.

Memory 10 comprises a plurality of memory blocks. Taking memory block 20 as an example, local word line driver 22 receives RS0-RS63, RRS0-RRS1, and the plurality of predecoded block signals from block decoder 15. Whether RRS0 and RRS1 are active depends on whether a defective row was detected and corresponding fuses are blown. If the plurality of predecoded block signals select block 20, local word line driver 22 selects one local word line in response to the row select signals and the plurality of signals provided by block decoder 15. If ROW ADDRESS indicates that row 40 is addressed, $RS_{40}$ is asserted. If the plurality of predecoded block signals further selects memory block 20 and local word line 26, then local word line driver 22 provides local word line 26. Since memory cell 24 is located on a selected word line, memory cell 24 couples its stored bit differentially onto bit line pair 28. A plurality of other memory cells on the selected word line also couple their stored bits differentially onto corresponding bit line pairs. Since memory array 21 comprises a plurality of bit line pairs, column decoder 16 provides further decoding to select one or more bit line pairs, based on COLUMN ADDRESS. The number of bit line pairs selected by column decoder 16 is determined by the organization of memory 10, which is the number of bits input and output on DATA. After column decoder 16 selects one or more bit line pairs, the one or more bit line pairs are sensed and amplified by data input/output portion 18 and provided as DATA.

In a write mode of memory 10, the flow of DATA is reversed, and DATA is received by data input/output portion 18 and provided on one or more selected bit lines and stored in one or more corresponding memory cells located at intersections of selected local word lines and selected bit line pairs.

Figure 2:
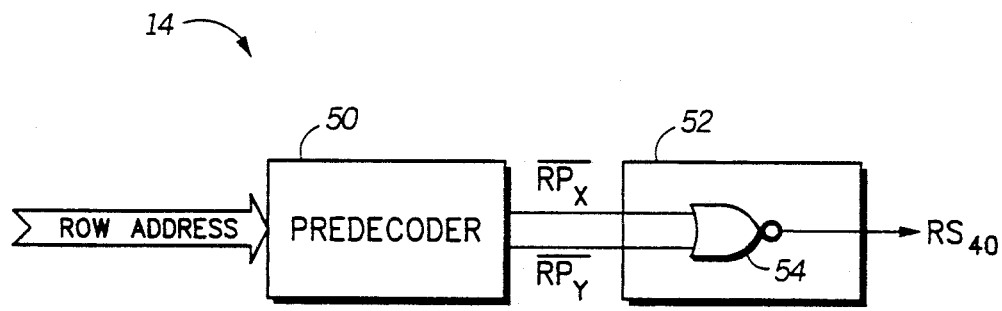
FIG. 2 shows a partial block diagram and a partial logic diagram of the row decoder of FIG. 1.

FIG. 2 shows row decoder 14 of FIG. 1 in greater detail, comprising a predecoder 50, and a decoder 52 comprising a plurality of logic elements including a NOR gate 54. Predecoder 50 receives ROW ADDRESS and predecodes ROW ADDRESS to provide a plurality of predecoded signals like $\overline{RP_X}$ and $\overline{RP_Y}$. Decoder 52 receives the plurality of predecoded signals and performs predetermined logic operations on sets of them. In the illustrated embodiment, decoder 52 receives sets of two predecoded signal lines and performs a logical NOR operation on them to provide row select signals like $RS_{40}$. $RS_{40}$ is the row select line for row 40 shown in FIG. 1. While a NOR operation on two predecoded signals is performed in the preferred embodiment, it should be apparent that other combinations of sets of signals and logical operations are possible.

Figure 3:
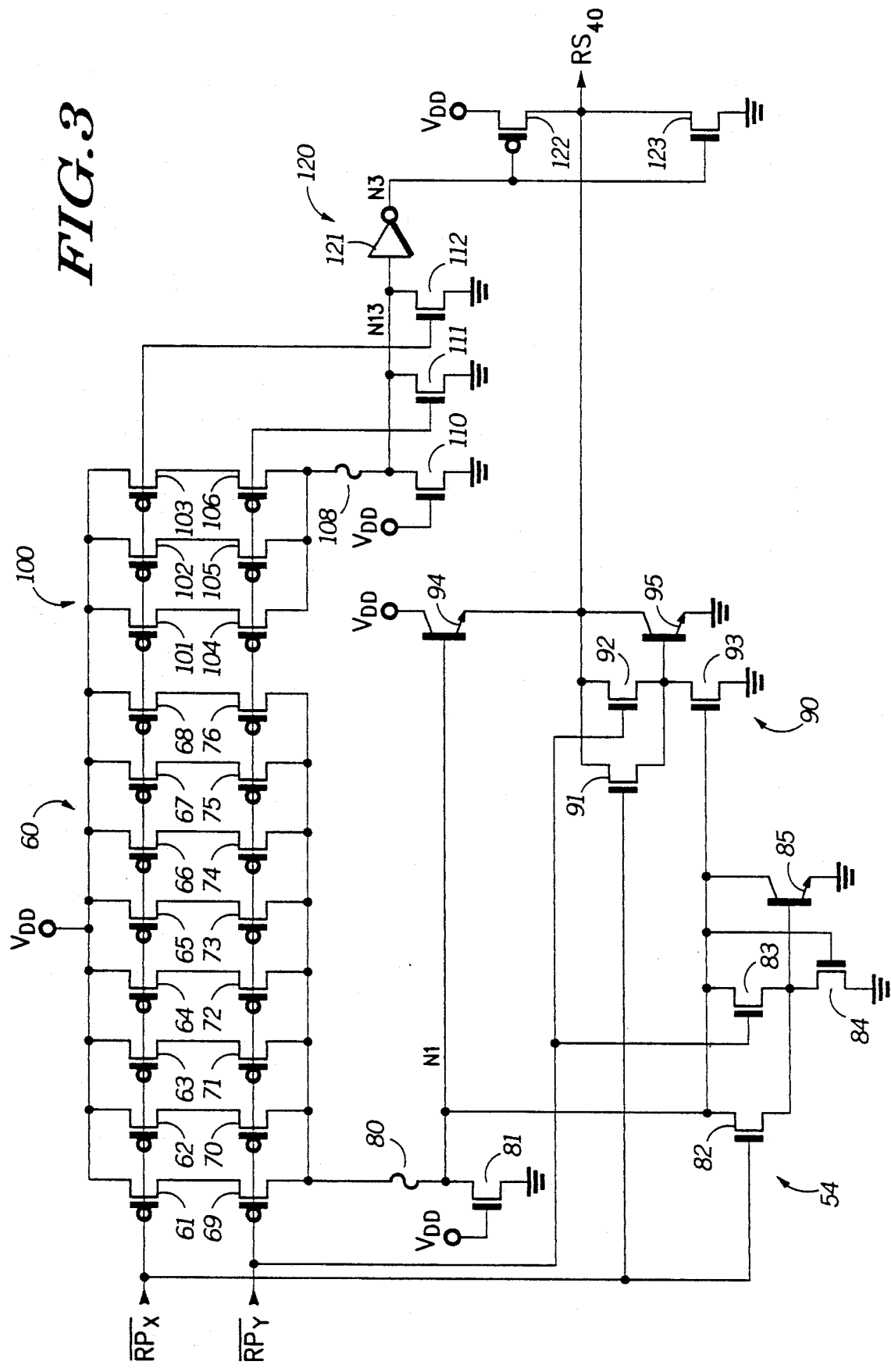
FIG. 3 illustrates in schematic form a NOR gate with internal fusing used in the row decoder of FIG. 2.

FIG. 3 shows NOR gate 54 of FIG. 2 which provides a mechanism for deselecting a defective row without increasing an access time of memory 10. The high speed of the memory is maintained by providing deselection fuses on internal nodes to a NOR gate which comprises a second part of a row decoder, and therefore isolates the fuses from the highly loaded row select lines.

NOR gate 54 comprises a first NOR gate 60, a first output driver 90, a second NOR gate 100, and a second output driver 120. NOR gate 60 and output driver 90 operates in parallel with NOR gate 100 and output driver 120 to provide $RS_{40}$ as a logical NOR of signals $\overline{RP_X}$ and $\overline{RP_Y}$. Output drivers 90 and 120 are both included in NOR gate 54 to provide proper drive characteristics on signal $RS_{40}$ in a manner that will be explained more fully later.

First NOR gate 60 comprises P-channel transistors 61-76, a fuse 80, N-channel transistors 81-84, and an NPN bipolar transistor 85. P-channel transistors 61-68 each have a first current electrode connected to a power supply voltage terminal labelled "$V_{DD}$", a control electrode for receiving signal $\overline{RP_X}$, and a second current electrode. $V_{DD}$ is a positive power supply voltage terminal and is approximately 5 volts. P-channel transistors 69-76 each have a first current electrode connected to the second current electrodes of transistors 61-68, respectively, a control electrode for receiving signal $\overline{RP_Y}$, and a second current electrode. The second current electrodes of transistors 69-76 are connected together. Fuse 80 has a first terminal connected to the second current electrodes of transistors 69-76, and a second current electrode connected to a node labelled "N1". Transistor 81 has a first current electrode connected to the second terminal of fuse 80, a control electrode connected to $V_{DD}$, and a second current electrode connected to a power supply voltage terminal labelled "$V_{SS}$". $V_{SS}$ is a ground power supply voltage terminal and is approximately 0 volts. Transistor 82 has a first current electrode connected to the second terminal of fuse 80, a control electrode for receiving $RP_X$, and a second current electrode. Transistor 83 has a first current electrode connected to the second terminal of fuse 80, a control electrode for receiving $RP_Y$, and a second current electrode connected to the second current electrode of transistor 82. Transistor 84 has a first current electrode connected to the second current electrodes of transistors 82 and 83, a control electrode connected to the second terminal of fuse 80, and a second current electrode connected to $V_{SS}$. Transistor 85 has a collector connected to the second terminal of fuse 80, a base connected to the second current electrode of transistor 82, and an emitter connected to $V_{SS}$.

Output driver 90 comprises N-channel transistors 91–93, and NPN bipolar transistors 94 and 95. Transistor 91 has a first current electrode connected to $RS_{40}$, a control electrode for receiving $\overline{RP_X}$, and a second current electrode. Transistor 92 has a first current electrode connected to signal $RS_{40}$, a control electrode for receiving signal $\overline{RP_Y}$, and a second current electrode connected to the second current electrode of transistor 91. Transistor 93 has a first current electrode connected to the second current electrodes of transistors 91 and 92, a control electrode connected to the second terminal of fuse 80, and a second current electrode connected to $V_{SS}$. Transistor 94 has a collector connected to $V_{DD}$, a base connected to the second terminal of fuse 80, and an emitter connected to the first current electrodes of transistors 91 and 92 and supplying signal $RS_{40}$ thereon. Transistor 95 has a collector connected to the emitter of transistor 94, a base connected to the second current electrodes of transistors 91 and 92, and an emitter connected to $V_{SS}$.

NOR gate 100 comprises P-channel transistors 101–106, a fuse 108, and N-channel transistors 110–112. Transistors 101–103 each have a first current electrode connected to $V_{DD}$, a control electrode for receiving $RP_X$, and a second current electrode. Transistors 104–106 each have a first current electrode connected to the second current electrodes of transistors 101–103, respectively, a control electrode for receiving $\overline{RP_Y}$, and a second current electrode. The second current electrodes of transistors 104–106 are connected together. Fuse 108 has a first terminal connected to the second current electrodes of transistors 104–106, and a second terminal connected to a node labelled "N13". Transistor 110 has a first current electrode connected to the second terminal of fuse 108, a control electrode connected to $V_{DD}$, and a second current electrode connected to $V_{SS}$. Transistor 111 has a first current electrode connected to the second terminal of fuse 108, a control electrode for receiving $\overline{RP_Y}$, and a second current electrode connected to $V_{SS}$. Transistor 112 has a first current electrode connected to the second terminal of fuse 108, a control electrode for receiving $\overline{RP_X}$, and a second current electrode connected to $V_{SS}$.

Output driver 120 comprises an inverter 121, a P-channel transistor 122, and an N-channel transistor 123. Inverter 121 has an input terminal connected to the second terminal of fuse 108, and an output terminal connected to a node labelled "N3". Transistor 122 has a first current electrode connected to $V_{DD}$, a control electrode connected to the output terminal of inverter 121, and a second current electrode connected to signal $RS_{40}$. Transistor 123 has a first current electrode connected to the second current electrode of transistor 122, a control electrode connected to the output terminal of inverter 121, and a second current electrode connected to $V_{SS}$.

NOR gate 60 operates in conjunction with output driver 90 to quickly provide signal $RS_{40}$ at one diode drop, or about 0.7 volts, above $V_{SS}$ or below $V_{DD}$, whichever the case may be. NOR gate 100 operates along with output driver 120 to then provide $RS_{40}$ at CMOS levels, which are closer to power supplies $V_{DD}$ or $V_{SS}$. Transistors 61–68 operate equivalently to a single transistor with a size equal to the sum of the sizes of transistors 61–68, but are separated for convenience in layout verification. Likewise, transistors 69–76 operate equivalently to a single transistor with a size equal to the sum of the sizes of transistors 69–76. When either $\overline{RP_X}$ or $\overline{RP_Y}$ is a logic high, signal $RS_{40}$ remains negated at a logic low. When both $RP_X$ and $RP_Y$ are asserted at a logic low, NOR gate 54 asserts $RS_{40}$, selecting row 40 of FIG. 1, and the delay from $\overline{RP_X}$ and $RP_Y$ to $RS_{40}$ determines in part the access time of the memory. Therefore, the effect of row redundancy on speed when $RS_{40}$ is asserted is critical.

When both $RP_X$ and $RP_Y$ are a logic low, transistors 61–68 and 69–76 are conductive and, assuming fuse 80 is intact, provide a voltage on node N1 approximately equal to $V_{DD}$. Since both $\overline{RP_X}$ and $\overline{RP_Y}$ are a logic low, transistors 82 and 83 are nonconductive. Transistor 84 is conductive, however, and couples $V_{SS}$ to the base of transistor 85. Transistor 85, then, has a reverse biased collector to base junction, and no forward bias on the base to emitter junction, and a reverse saturation current flows into the collector of transistor 85. Transistor 81 is a weak pulldown transistor and is sized so that transistors 61–76 easily overdrive transistor 81 when transistors 61–76 are conductive. Therefore, node N1 remains at a high voltage.

With N1 at a high voltage, the collector-base junction of transistor 94 is reverse biased, and the base emitter junction of transistor 94 is forward biased, so that transistor 94 conducts a current onto $RS_{40}$ until the voltage on $RS_{40}$ rises to a point at which the base-emitter junction is no longer forward biased. It can be seen that with $\overline{RP_X}$ and $\overline{RP_Y}$ at a logic low, transistors 91 and 92 are both nonconductive, and since N1 is at a high voltage, transistor 93 is conductive. Because transistor 93 is conductive, the base-emitter junction of transistor 95 is not forward biased, and even though the collector-base junction is reversed biased, substantially no current flows through transistor 95. Therefore all the current conducted through transistor 94 flows into $RS_{40}$ and the voltage on $RS_{40}$ rises until it is about one diode drop below the voltage on N1, or approximately $V_{DD}-0.7$ volts.

At the same time, NOR gate 100 and output driver 120 are operating. Like corresponding transistors in NOR gate 60, transistor groups 101–103 and 104–106 operate like single transistors of appropriate sizes. When $\overline{RP_X}$ and $\overline{RP_Y}$ are asserted at logic low voltages, transistors 101–106 are conductive and, assuming fuse 108 is not blown, couple node N13 substantially to $V_{DD}$. Transistor 110 is a weak pulldown, and is sized to ensure that transistors 101–106 easily overdrive transistor 110 when transistors 101-106 are conductive. Transistors 111 and 112 are both nonconductive due to the low voltage on their respective control electrodes. Therefore N13 is at a high voltage. Inverter 121 provides a low voltage on node N3 in response, making transistor 123 nonconductive, transistor 122 conductive, and increasing the voltage on $RS_{40}$ from $V_{DD}$ minus 0.7 volts to $V_{DD}$ minus the drain to source voltage of transistor 122. Since the gate-to-source voltage of transistor 122 is approximately a negative $V_{DD}$, transistor 122 is conductive and is in saturation while the voltage on $RS_{40}$ continues to rise from approximately $V_{DD}-0.7$ volts to approximately $V_{DD}$.

The timing of NOR gate 60 relative to NOR gate 100 is important to ensure proper operation of NOR gate 54. If transistor 122 were to become conductive when transistor 95 was still conductive, a large "crowbar" current would flow from $V_{DD}$ through transistor 122 into the collector of transistor 95 to $V_{SS}$, until transistor 95 became nonconductive. In order to alleviate this problem, transistors 101-106 are sized smaller than transistors 61-76 so that N13 is driven to a logic high some amount of time after N1 switches to a logic high.

In order to deselect a particular row in which a defect has been found, fuses 80 and 108 are blown. When fuses 80 and 108 are blown, nodes N1 and N13 are pulled to $V_{SS}$ by pulldown transistors 81 and 110, respectively, ensuring that $RS_{40}$ is always at a logic low. Fuses 80 and 108, which are implemented in relatively narrow segments of polysilicon to facilitate blowing with a high energy laser, add loading when they are placed in circuitry. Placing fuses 80 and 108 inside NOR gate 54 reduces the adverse effects on the speed of row select circuit 52 of FIG. 2 that would otherwise be encountered.

The amount of loading on the second current electrodes of transistors 69-76, and transistors 104-106, are relatively small compared to the loading on signal $RS_{40}$. Considering FIG. 1 again, row decoder 14 must provide row select signals RS0-RS63 to each of a plurality of memory blocks like 20 and 30. While the number of memory blocks may be altered by changing the number of address bits used for block, row, and column decoding, the physical size of commercially useful integrated circuit memories is large, and loading caused by capacitance of a row select signal to the substrate will necessarily be large, typically several picofarads. A fuse, being a narrow strip of polysilicon, adds series resistance to a conductor that is already highly capacitively loaded. High speed memories, such as static random access memories, are increasingly required to provide higher densities and faster speed. The loading of fuses on row select lines is no longer tolerable. However, placing fuses 80 and 108 within NOR gate 54 allows the extra loading of the fuses to be placed on less highly loaded nodes, leaving the speed of $RS_{40}$ and hence the access time of memory 10 of FIG. 1 virtually unaffected. In the preferred embodiment, a speed degradation of only approximately 50 picoseconds was encountered by using fuses over non-fused row select lines.

N1 and N13 within NOR gate 54 have much smaller capacitances than $RS_{40}$. The capacitance on the second current electrodes of transistors 69-76 include gate and diffusion sidewall capacitances of transistors 81, 82, and 83, gate capacitance on transistor 84, the junction capacitance through the reverse biased collector-base diode of transistor 85, and the conductor to substrate routing capacitance. Since the sizes of transistors 81-85 are relatively small and the routing on node N1 is short, the total loading is small. Therefore, the series resistance added by fuse 80 combines with a small capacitance to yield a small RC time constant and fast rise time on signal N1. Similar considerations lead to the conclusion that the amount of capacitive loading on the second current electrodes of transistors 104-106 is small. However, because of the delay required in making transistor 122 conductive, the effect of fuse 108 on the rise time of node N13 is far less critical.

Figure 4:
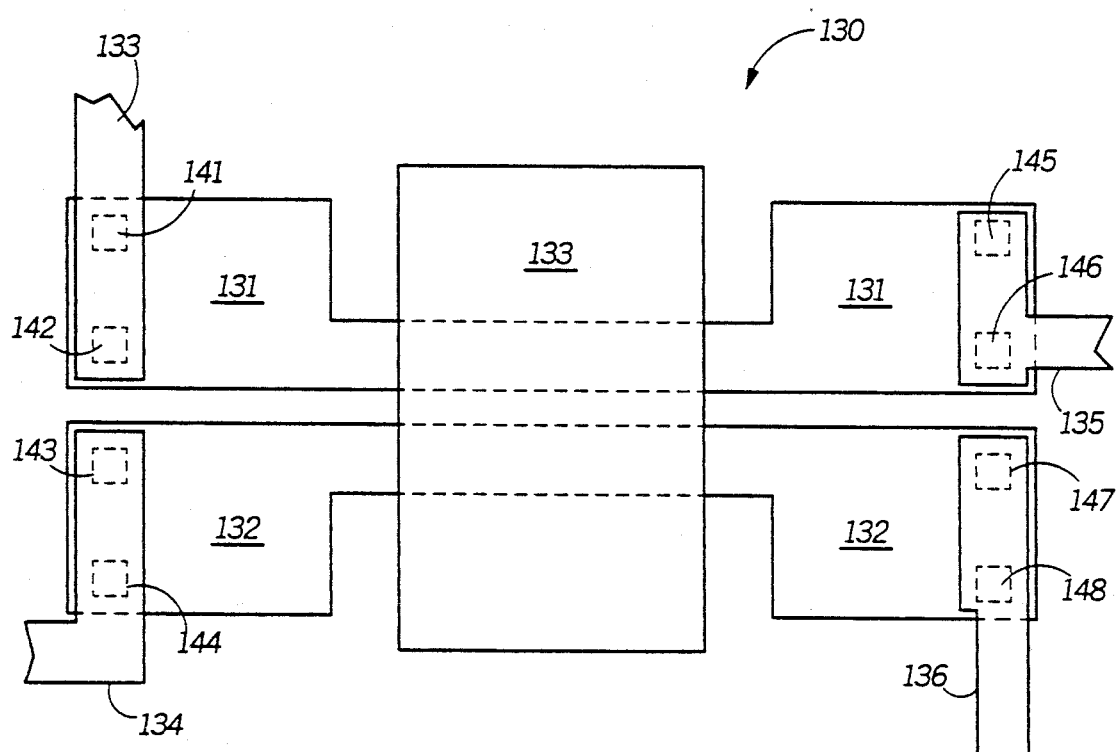
FIG. 4 illustrates a top view of an integrated circuit layout of the internal fusing of the row decoder of FIG. 3.

The loading caused by fuses 80 and 108 being placed within NOR gate 54 does not significantly slow down $RS_{40}$, and furthermore, the fuses may be fabricated adjacent to each other and both may be blown during a single fuse blowing operation. FIG. 4 illustrates a top view of a portion 130 of NOR gate 54 of FIG. 3 in which fuses 80 and 108 are fabricated adjacent to one another. Portion 130 comprises polysilicon segments 131 and 132, metal lines 133, 134, 135, and 136, and contacts 141, 142, 143, 144, 145, 146, 147, and 148. Polysilicon segment 131 contacts to metal line 133 through contacts 141 and 142 on one side, and to metal line 135 through contacts 145 and 146 on another side. Polysilicon segment 132 contacts to metal line 134 through contacts 143 and 144 on one side, and to metal line 136 through contacts 147 and 148 on another side. Overlying all of portion 130 is a layer of passivation which is present everywhere in portion 130 except within a region 133. Region 133 allows a high energy laser focused to the approximate vertical height of polysilicon segments 131 and 132 to "blow" or break polysilicon segments 131 and 132, which causes $RS_{40}$ to always be negated as a logic low voltage. Since fuses 80 and 108 may be fabricated adjacent to one another in this manner and only a single burst of a high energy laser is needed to blow the fuses, the fuse blowing operation for two fuses located inside NOR gate 54 is no more complicated than for blowing a single fuse connected serially to $RS_{40}$.

Furthermore, when adjacent polysilicon fuses are blown during a fusing operation by a high energy laser, the polysilicon material may splatter, causing shorts between adjacent circuits. However, NOR gate 54 prevents a short caused by such a splatter from affecting signal $RS_{40}$. If node N1 is shorted to node N13, no degradation will occur because nodes N1 and N13 are weakly pulled to $V_{SS}$ already by transistors 81 and 83 of FIG. 3, respectively.

It should be apparent that a memory has been described which provides row redundancy while maintaining high speed. The high speed of the memory is maintained by providing deselection fuses on internal nodes to a NOR gate which comprises a second part of a row decoder, and therefore isolates the fuses from the highly loaded row select lines. The fuses, furthermore, are laid out adjacent to each other so that only a single fuse operation is necessary to blow both fuses.

While the invention has been described in the context of a preferred embodiment, it will be apparent to those skilled in the art that the present invention may be modified in numerous ways and may assume many embodiments other than that specifically set out and described above. For example, signals $\overline{RP_X}$ and $\overline{RP_Y}$ could be implemented in positive, instead of negative, logic, and NOR gate 54 could be replaced by an AND gate with similar internal fusing. Also, as noted previously, transistor groups 61-68, 69-76, 101-103, and 104-106 could each be replaced by single transistors of corresponding size. Accordingly, it is intended by the appended claims to cover all modifications of the invention which fall within the true spirit and scope of the invention.

We claim:

1. A memory having a plurality of rows, said plurality of rows comprising at least one redundant row, comprising:
   predecoding means, for providing a plurality of predecoded signals in response to a row address;
   logic means coupled to said predecoding means, having input terminals for receiving groups of said predecoded signals, first internal terminals, second internal terminals, and internal nodes, for performing a predetermined logic operation on said groups of predecoded signals and for providing a result of said predetermined logic operation on corresponding internal nodes when a first internal terminal is coupled to a corresponding second internal terminal;
   fuse means coupled to said first and second internal terminals of said decoding means and to said internal node, for selectively coupling each first internal terminal of said row decoding means to said corresponding second internal terminal; and
   output means coupled to said internal node and to said plurality of rows, for providing a plurality of row select signals in response to a voltage at said corresponding internal nodes,
   each internal node characterized as having substantially smaller capacitive loading than a corresponding row.

2. The memory of claim 1 further comprising:
   local word line decoding means coupled to said output means, for providing one of a plurality of local word line signals in response to said plurality of row select signals and a block address;
   data storage means coupled to said local word line decoding means, having a plurality of memory cells located at intersections of word lines and bit line pairs, for storing a bit of data in a memory cell located at an intersection of an selected word line and an selected bit line pair during a write cycle, and for providing a bit of data on a corresponding bit line pair in response to an selected word line during a read cycle; and
   output means coupled to said data storage means, for enabling a bit line pair in response to a column address, for providing a data bit on said selected bit line pair during a write cycle, and for providing an output signal in response to a voltage on said selected bit line pair during a read cycle.

3. A memory comprising a plurality of memory cells, arranged in rows, for storing data; a plurality of row select lines, each of which is connected to memory cells in a different one of said rows; redundant memory cells arranged in at least one redundant row; redundancy select means, for selecting a redundant row in response to a selected address; a row decoder, comprising:
   predecoding means, for providing a plurality of predecoded signals in response to a row address;
   logic means coupled to said predecoding means, having input terminals for receiving groups of said predecoded signals, first internal terminals, second internal terminals, and internal nodes, for performing a predetermined logic operation on said groups of predecoded signals and for providing a result of said predetermined logic operation on corresponding internal nodes when a first internal terminal is coupled to a corresponding second internal terminal;
   fuse means coupled to said first and second internal terminals of said decoding means and to said internal node, for selectively coupling each first internal terminal of said row decoding means to said corresponding second internal terminal; and
   output means coupled to said internal node and to said plurality of rows, for providing a plurality of row select signals in response to a voltage at said corresponding internal nodes,
   each internal node characterized as having substantially smaller capacitive loading than a corresponding row.

4. The memory of claim 3 wherein said predetermined logic operation is a logical NOR.

5. The memory of claim 4 wherein said fuse means comprises first and second fuses corresponding to each of said plurality of row select signals.

6. The memory of claim 5 wherein both first and second fuses corresponding to a given row select signal are selectively cuttable during a single operation.

7. The memory of claim 3 further comprising:
   a plurality of memory blocks, having a plurality of memory cells arranged in said rows; and
   block decoding means, for selecting a block in response to said address.

8. The memory of claim 7 further comprising:
   column decoding means, for selecting a memory cell of the plurality of memory cells located in a selected block on an selected row; and
   output means, for providing a bit stored in said memory cell in response to a read operation of the memory.

9. In a memory having a plurality of rows, said plurality of rows comprising at least one redundant row, including predecoding means for providing a plurality of predecoded signals in response to a row address, and a row decoder coupled to the predecoding means, the row decoder comprising:
   a first decoder portion for receiving first and second predecoded signals and for performing a first portion of a predetermined logic operation between said first and second predecoded signals;
   a second decoder portion for receiving said first and second predecoded signals, and for performing a second portion of said predetermined logic operation between said first and second predecoded signals;
   a node predisposed between said first decoder portion and said second decoder portion;
   fuse means coupled to said node, for selectively coupling together said first decoder portion and said second decoder portion; and
   an output portion coupled to said node, for providing a row select signal in response to a predetermined logic operation if said fuse means couples said first decoder portion to said second decoder portion.

10. In the memory of claim 9 wherein said output portion of the row decoder is characterized as having substantially smaller capacitive loading a corresponding row.

11. In the memory of claim 9 wherein said first portion comprises at least one P-channel transistor.

12. In the memory of claim 9 wherein said second portion comprises at least one N-channel transistor.

* * * * *